(12) United States Patent
Wu et al.

(10) Patent No.: US 11,647,645 B2
(45) Date of Patent: May 9, 2023

(54) COVER PLATE USED IN ELECTRONIC DEVICE, ELECTRONIC DEVICE, AND METHOD OF MANUFACTURING COVER PLATE

(71) Applicant: TPK Advanced Solutions Inc., Fujian (CN)

(72) Inventors: Chun Yan Wu, Xiamen (CN); Lien-Hsin Lee, Taipei (TW); Shi Yuan Lian, Fu'an (CN); Xian Bin Xu, Xiamen (CN); Ming Qiang Fu, Liancheng County (CN); Ming Hsien Ko, Taichung (TW)

(73) Assignee: TPK Advanced Solutions Inc., Fujian (CN)

( * ) Notice: Subject to any disclaimer, the term of this patent is extended or adjusted under 35 U.S.C. 154(b) by 156 days.

(21) Appl. No.: 17/147,678

(22) Filed: Jan. 13, 2021

(65) Prior Publication Data

US 2022/0223816 A1 Jul. 14, 2022

(51) Int. Cl.
*G06F 3/041* (2006.01)
*H04M 1/02* (2006.01)

(52) U.S. Cl.
CPC ........... *H10K 50/841* (2023.02); *G06F 3/041* (2013.01); *H04M 1/0214* (2013.01); *H10K 50/86* (2023.02); *H10K 59/40* (2023.02); *H10K 71/00* (2023.02); *H10K 77/111* (2023.02); *G06F 2203/04105* (2013.01); *H10K 2102/311* (2023.02)

(58) Field of Classification Search
CPC .......... G06F 2203/04105; G06F 3/041; H01L 2251/5338; H01L 27/323; H01L 51/0097; H01L 51/524; H01L 51/5281; H01L 51/56; H04M 1/0214
See application file for complete search history.

(56) References Cited

U.S. PATENT DOCUMENTS

| | | | |
|---|---|---|---|
| 11,493,794 B2 * | 11/2022 | Wu | ...................... H01L 51/0097 |
| 2017/0171968 A1 * | 6/2017 | Heo | ........................ B32B 17/10 |
| 2020/0042116 A1 * | 2/2020 | Li | .......................... G06F 3/0412 |
| 2020/0043951 A1 * | 2/2020 | Calabrese | ........... H01L 27/3225 |
| 2020/0225699 A1 | 7/2020 | Yu et al. | |
| 2020/0262746 A1 * | 8/2020 | He | ........................ B32B 27/306 |
| 2020/0266542 A1 * | 8/2020 | Mu | .......................... H01Q 7/00 |
| 2022/0221749 A1 * | 7/2022 | Wu | ....................... H01L 27/323 |

FOREIGN PATENT DOCUMENTS

| CN | 104039544 A | 9/2014 |
|---|---|---|
| CN | 108463339 A | 8/2018 |

* cited by examiner

*Primary Examiner* — Afroza Chowdhury
(74) *Attorney, Agent, or Firm* — Cooper Legal Group, LLC

(57) ABSTRACT

A cover plate used in an electronic device includes a glass layer and at least one transparent covering layer. The glass layer has a first surface and a second surface. The transparent covering layer contacts and is disposed on at least one of the first surface and the second surface, and the transparent covering layer is laminated with the glass layer. The cover plate has a Young's modulus of about 10 GPa to about 200 GPa.

24 Claims, 9 Drawing Sheets

COVER PLATE USED IN ELECTRONIC DEVICE, ELECTRONIC DEVICE, AND METHOD OF MANUFACTURING COVER PLATE

BACKGROUND

Technical Field

The present disclosure relates to a cover plate used in an electronic device, an electronic device, and a method of manufacturing a cover plate, and more particularly, to an electronic device including a flexible screen cover plate.

Description of Related Art

Recently, mobile phones with foldable screens have been launched on the market. For mobile phone manufacturers, mobile phones with foldable screens can not only establish brand images, but also increase product prices. Mobile phones with foldable screens will also replace tablets and even notebook computers as a new source of business growth. For supply chain manufacturers, mobile phones with foldable screens will bring new demands and improve their profitability.

In order to achieve foldable effects, cover plates of some existing foldable screens are implemented with plastic films (such as polymer films). In addition to flexibility, these films need to be thin, have high hardness, have high temperature resistance, and have high light transmittance. However, from the experimental data, if the foldable screen made of plastic film is folded a certain number of times, the cover plate does not have a high stress release ability due to the use of plastic film (it can also be said that the cover plate made of plastic film has a low Young's modulus), so crease damage will be formed after repeated folding and the flatness of the cover plate will be affected, which will further cause the optical performance (e.g., brightness, contrast) to be greatly reduced. Additionally, from US Patent Application Publication No. 20200225699A, it is known that the use of optical clear adhesive (OCA) or pressure sensitive adhesive (PSA) as a coupling between stacked structures not only increases the overall thickness, but also easily forms crack gaps after repeated folding. Accordingly, how to provide an electronic device to solve the aforementioned problems becomes an important issue to be solved by those in the industry.

SUMMARY

An aspect of the disclosure is to provide an electronic device and a method of manufacturing the same that can efficiently solve the aforementioned problems.

According to an embodiment of the disclosure, a cover plate used in an electronic device includes a glass layer and at least one transparent covering layer. The glass layer has a first surface and a second surface. The at least one transparent covering layer is laminated with the glass layer. The at least one transparent covering layer is disposed on and in contact with at least one of the first surface or the second surface. The cover plate has a Young's modulus of about 10 GPa to about 200 GPa.

In an embodiment of the disclosure, the glass layer is an ultra-thin glass layer having a thickness of less than about 100 microns.

In an embodiment of the disclosure, the thickness of the glass layer is from about 25 microns to about 100 microns.

In an embodiment of the disclosure, the thickness of the glass layer is from about 25 microns to about 35 microns.

In an embodiment of the disclosure, the at least one transparent covering layer has a thickness from about 5 microns to about 10 microns.

In an embodiment of the disclosure, the at least one transparent covering layer includes polyimide (PI) or colorless polyimide (CPI).

In an embodiment of the disclosure, the at least one transparent covering layer is added with an inorganic mixture.

In an embodiment of the disclosure, the inorganic mixture includes graphene.

In an embodiment of the disclosure, the Young's modulus of the cover plate compounded with the inorganic mixture is from about 8 GPa to about 200 GPa.

In an embodiment of the disclosure, the Young's modulus of the cover plate compounded with the inorganic mixture is from about 80 GPa to about 200 GPa.

In an embodiment of the disclosure, the at least one transparent covering layer includes a first transparent covering layer and a second transparent covering layer. The glass layer is laminated between the first transparent covering layer and the second transparent covering layer.

According to an embodiment of the disclosure, an electronic device includes the cover plate and a touch sensing layer. The touch sensing layer is disposed under the cover plate.

In an embodiment of the disclosure, the touch sensing layer is disposed on and in contact with the second surface of the glass layer.

In an embodiment of the disclosure, the touch sensing layer is disposed on and in contact with the at least one transparent covering layer.

In an embodiment of the disclosure, the electronic device further includes a polarizing layer. The polarizing layer is disposed between the touch sensing layer and the cover plate.

In an embodiment of the disclosure, the polarizing layer is disposed on and in contact with the cover plate.

In an embodiment of the disclosure, the electronic device further includes a hard coating layer. The hard coating layer is disposed above the cover plate.

According to an embodiment of the disclosure, an electronic device includes a first screen, a second screen, and the cover plate. The second screen is rotatably connected to the first screen. The cover plate covers the first screen and the second screen.

In an embodiment of the disclosure, the first screen and the second screen are touch display screens.

In an embodiment of the disclosure, each of the touch display screens includes a force sensing layer.

According to an embodiment of the disclosure, an electronic device includes the cover plate and is a folding mobile phone.

According to an embodiment of the disclosure, a method of manufacturing a cover plate includes: coating a polymer material layer on at least one surface of a glass layer; and drying the polymer material layer to form at least one transparent covering layer, in which the glass layer and the at least one transparent covering layer form a cover plate having a Young's modulus of about 10 GPa to about 200 GPa.

In an embodiment of the disclosure, the coating the polymer material layer adopts a slot die coating process.

In an embodiment of the disclosure, a drying temperature during the drying of the polymer material layer is from about 80 degrees Celsius to about 350 degrees Celsius.

Accordingly, in the cover plate of the present disclosure, the transparent covering layer is disposed on and in contact with the glass layer (substantially ultra-thin glass). In other words, the transparent covering layer and the glass layer are not adhered to each other with adhesive (e.g., OCA). Therefore, the overall thickness of the cover plate and the formation of pores and unnecessary cracks during the bending process can not only be reduced, but also the surface performance (e.g., wear resistance, hardness) of the cover plate can be effectively improved. In addition, the lack of the use of adhesive can simplify the manufacturing process, thereby reducing manufacturing costs.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
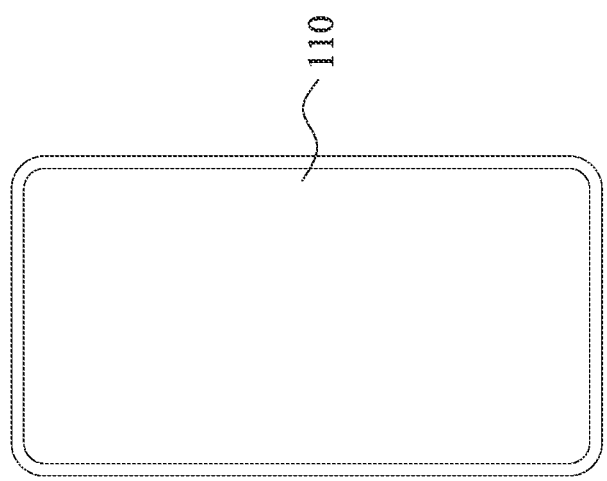
FIG. 1A is a schematic diagram showing an electronic device in a use state according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

The terms "about" and "approximately" as used herein indicate the value of a given quantity that varies within 20% of the value, preferably 10% of the value, more preferably 5%, 3%, 2%, 1%, or 0.5% of the value. It is noted that, the quantity provided in the specification is an approximate quantity, that is, if there is no specific description of "about" or "approximately", "about" and "approximately" can still be implied.

Figure 1B:
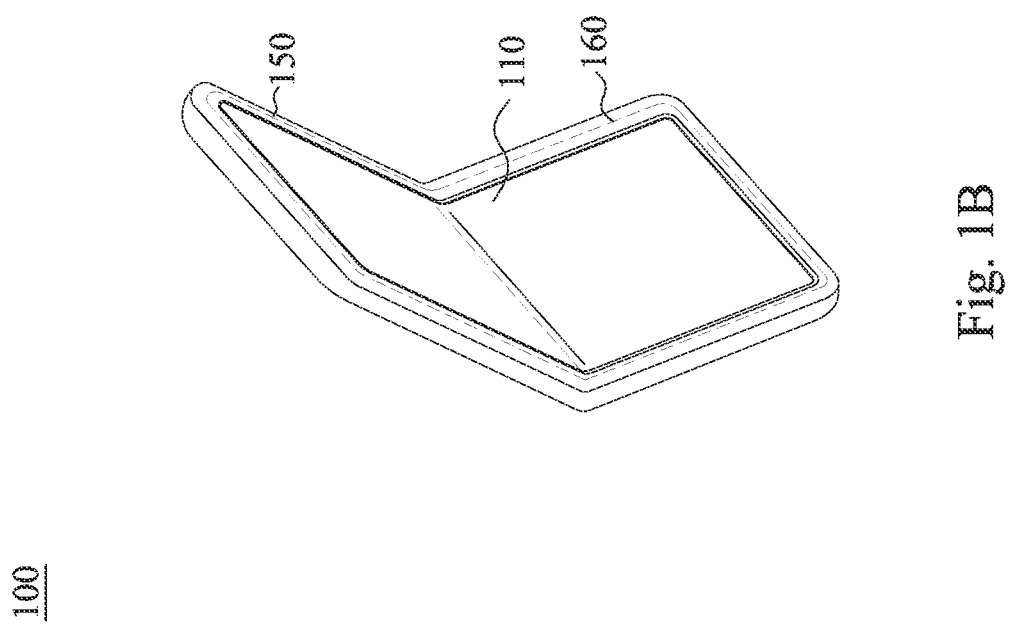
FIG. 1B is a schematic diagram showing the electronic device in FIG. 1A in another use state.

Reference is made to FIGS. 1A and 1B. FIG. 1A is a schematic diagram showing an electronic device 100 in a use state according to an embodiment of the present disclosure. FIG. 1B is a schematic diagram showing the electronic device 100 in FIG. 1A in another use state (when operating the electronic device 100 when folded). In the present embodiment, the electronic device 100 is a foldable mobile phone including a cover plate 110 for example, but the disclosure is not limited in this regard. In some other embodiments, the electronic device 100 can also be a tablet computer or a notebook computer. For example, the electronic device 100 is a dual-screen notebook computer including a first screen 150 and a second screen 160 (indicated by dotted lines in FIG. 1B). The second screen 160 is rotatably connected to the first screen 150 (e.g., through a hinge) and configured to display a virtual keyboard (not shown).

In some embodiments, the first screen 150 and the second screen 160 are touch display screens. In some embodiments, each of the touch display screens includes a force sensing layer for implementing pressure sensing or tactile feedback with the effect of an actuator.

Figure 2:
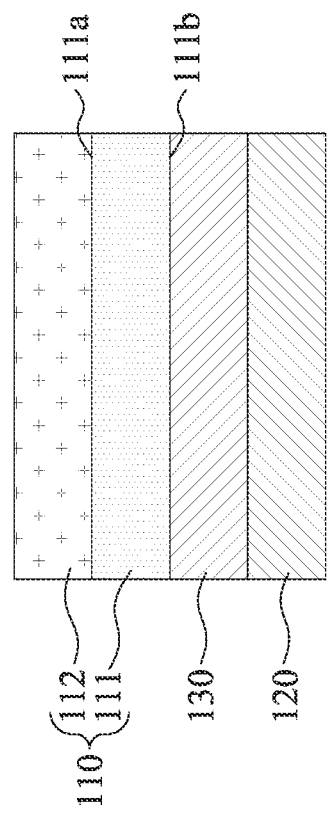
FIG. 2 is a schematic cross-sectional view showing some components of the electronic device in FIG. 1A according to an embodiment of the present disclosure.

Reference is made to FIG. 2. FIG. 2 is a schematic cross-sectional view showing some components of the electronic device 100 in FIG. 1A according to an embodiment of the present disclosure. As shown in FIG. 2, in the present embodiment, the cover plate 110 includes a glass layer 111 and a transparent covering layer 112. The glass layer 111 has a first surface 111a and a second surface 111b respectively located at opposite sides. The transparent covering layer 112 is disposed on and in contact with the first surface 111a, and the transparent covering layer 112 is laminated with the glass layer 111. In a specific embodiment, the glass layer 111 has a thickness from about 20 microns to about 100 microns (e.g., preferably between about 25 microns to about 35 microns, and this range enables the glass layer 111 to have a sufficiently thin thickness and sufficient stress support effect). Therefore, the glass layer 111 is an ultra-thin glass layer.

Figure 3:
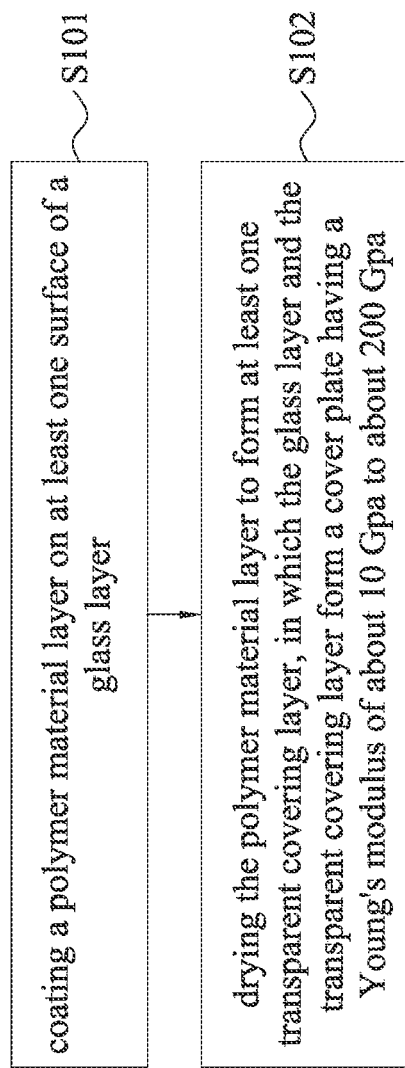
FIG. 3 is a flowchart of a method of manufacturing a cover plate according to an embodiment of the present disclosure.

Reference is made to FIG. 3. FIG. 3 is a flowchart of a method of manufacturing a cover plate (e.g., the cover plate 110) according to an embodiment of the present disclosure. As shown in FIG. 3, the method of manufacturing the cover plate includes steps S101 and S102.

In step S101, a polymer material layer is coated on at least one surface of a glass layer (e.g., the glass layer 111).

In step S102, the polymer material layer is dried to form at least one transparent covering layer (e.g., the transparent covering layer 112), in which the glass layer and the transparent covering layer form a cover plate having a Young's modulus of about 10 GPa to about 200 GPa.

It can be seen from the above steps that the transparent covering layer 112 is a dried polymer material layer. The polymer material layer preferably includes polyimide (PI) or colorless polyimide (CPI), but the disclosure is not limited in this regard. Preferably, a coatable liquid polyimide material (such as soluble polyimide (SPI)) is used, which has the characteristics of low hygroscopic expansion coefficient, low viscosity, and high transparency. The transparent covering layer 112 has a thickness from about 3 microns to about 50 microns, and preferably from about 5 microns to about 15 microns (e.g., the optimal thickness is from about 5 microns to about 10 microns).

In some embodiments, the polymer material layer is a coating that is coated on the glass layer 111 by a slot die coating process, but the disclosure is not limited in this regard. In some embodiments, a drying temperature during the drying of the polymer material layer is from about 80 degrees Celsius to about 350 degrees Celsius, for example, from about 80 degrees Celsius to about 150 degrees Celsius or from about 200 degrees Celsius to about 350 degrees Celsius, but the disclosure is not limited in this regard.

In some embodiments, the polymer material layer also includes an organic solvent for dissolving polyamide acid in the coating stage to form a polymer coating layer. The organic solvent is, for example, methyl isobutyl ketone (MIBK), propylene glycol monomethyl etherate (PGMEA), isopropanol (IPA), dimethylacetamide (DMAC), and the like. In some embodiments, the polymer material layer also includes a coupling agent. The content of polyamide acid is preferably from about 3 wt % to about 15 wt %, and the added amount of coupling agent is preferably from about 0.5 wt % to about 10 wt % of the content of polyamide acid, but the disclosure is not limited in this regard. Anything that can be used as a solvent belongs to the scope of the organic solvent of the present disclosure.

In some embodiments, the viscosity of the polymer coating layer is from about 100 cps to about 5000 cps; preferably, the polymer coating layer has a viscosity of about 300 cps to about 1000 cps.

In some embodiments, the material of the transparent covering layer 112 may also include transparent materials such as polyethylene naphthalate (PEN), polyvinylidene fluoride (PVDF), or polycarbonate (PC), but the disclosure is not limited in this regard. According to the aforementioned parameters and the number of layers used in combination with the glass layer 111 and the transparent covering layer 112 (e.g., one or two layers), the cover plate 110 can have a Young's modulus from about 10 GPa to about 200 GPa. In the present disclosure, it should be noted that the transparent covering layer 112 and the glass layer 111 are not adhered to each other by adhesive (e.g., OCA), and the polymer material layer (such as the coatable liquid polyimide) is directly formed on and in contact with one or both sides of the glass layer 111. Therefore, not only can the overall thickness of the cover plate 110 be reduced, but also the surface performance (e.g., having the effects of stress buffering and anti-bending, abrasion resistance, hardness, and the like combined by the composite cover plate) of the cover plate 110 can be effectively improved. In addition, without the use of adhesive, the manufacturing process of a module including the cover plate 110 can be simplified and the thickness can be reduced, such that the manufacturing cost can be reduced. Furthermore, an inorganic mixture can be added to the transparent covering layer 112 (or further to a transparent covering layer 113) of the cover plate 110 of the present disclosure, which will be explained in the subsequent embodiments.

Figure 4:
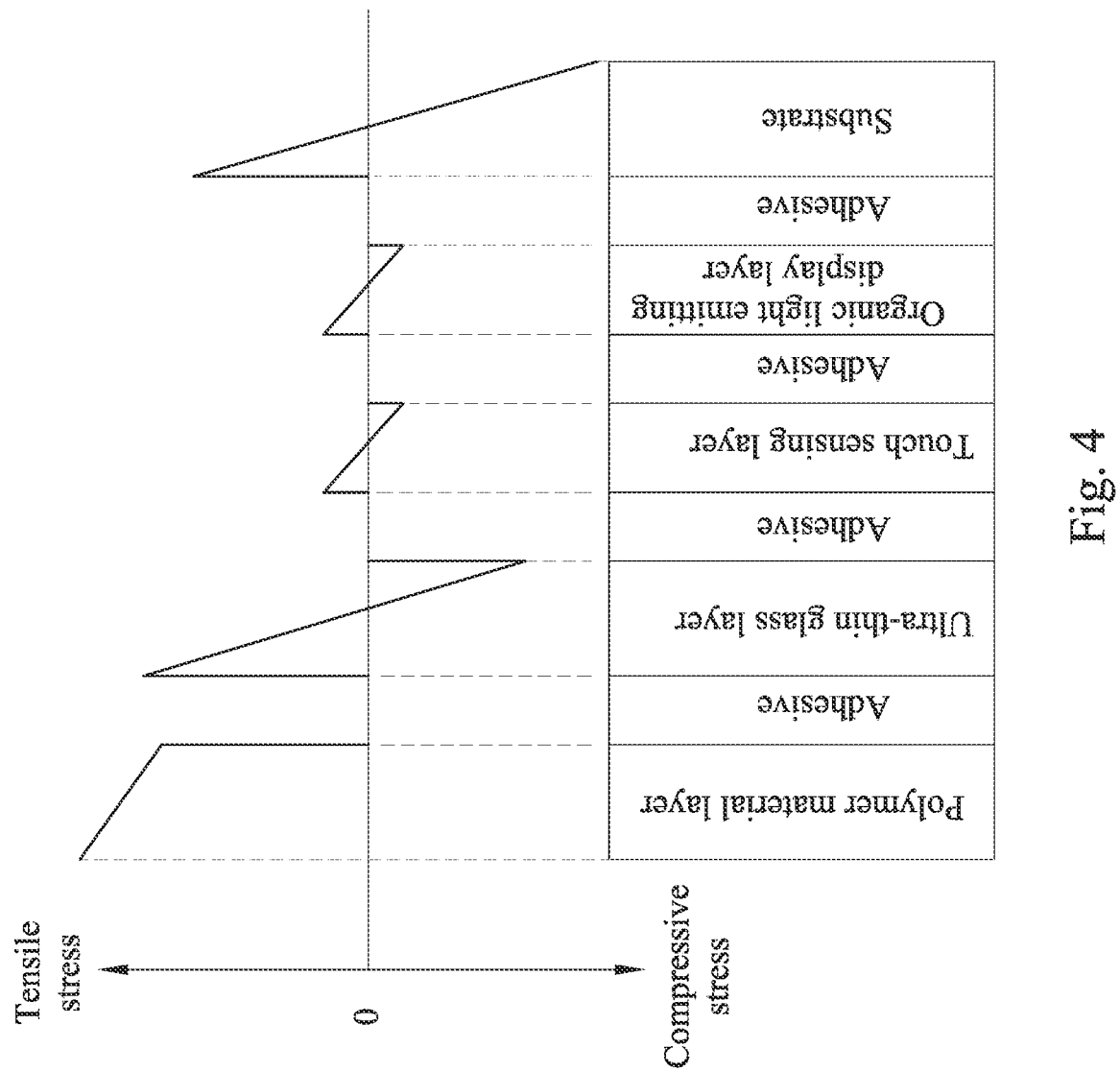
FIG. 4 is a graph showing the stress of a stacked structure when the stacked structure is bent.
Figure 5:
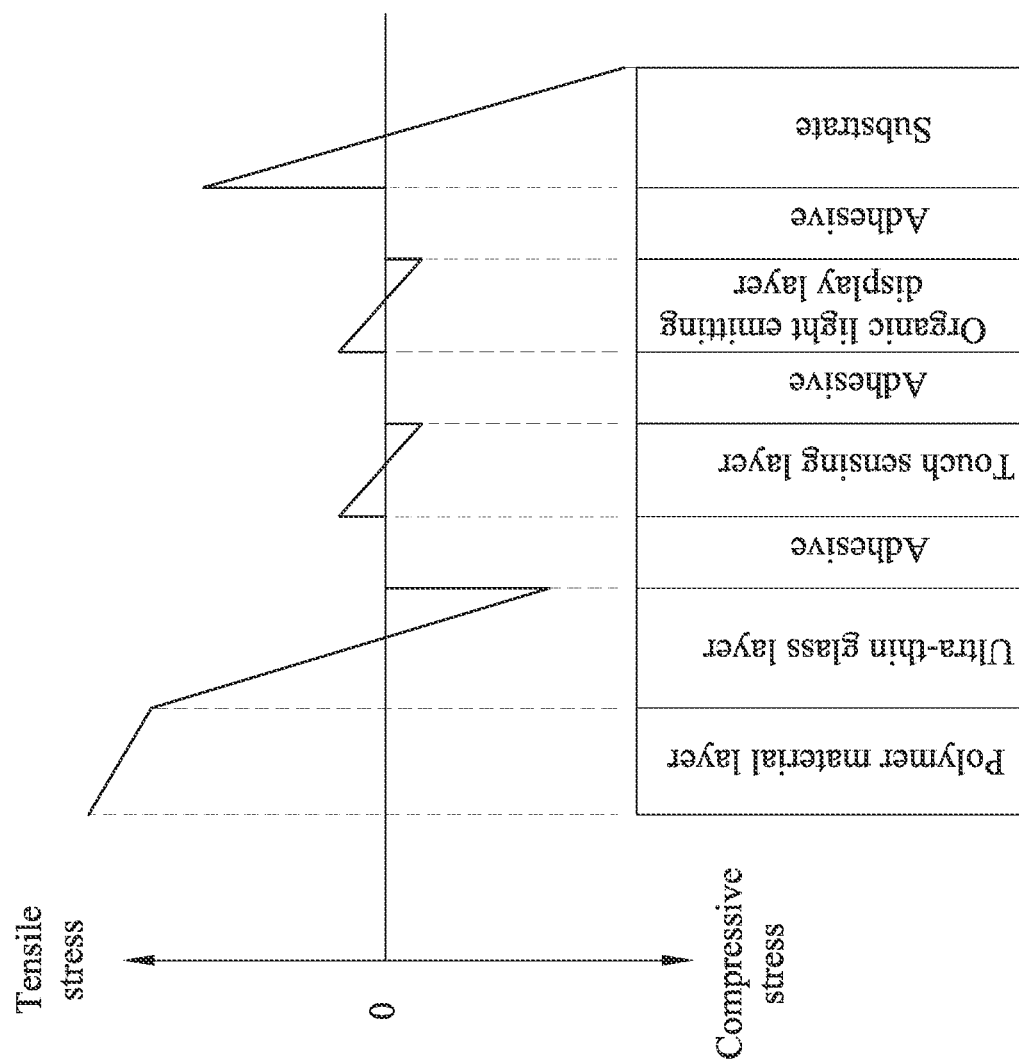
FIG. 5 is a graph showing the stress of another stacked structure when the stacked structure is bent.

Reference is made to FIGS. 4 and 5. FIG. 4 is a graph showing the stress of a stacked structure when the stacked structure is bent. FIG. 5 is a graph showing the stress of another stacked structure when the stacked structure is bent. The difference between the stacked structure shown in FIG. 4 and the stacked structure shown in FIG. 5 is that the glass layer and the transparent covering layer in FIG. 4 are attached to each other through an adhesive, while the glass layer and the transparent covering layer in FIG. 5 are directly attached to each other. In addition, when the stacked structure is bent, no stress is applied to parts of the adhesive. However, it can be seen from FIGS. 4 and 5 that even if the adhesive is not under stress, there is no significant difference in tensile stress between the transparent covering layer in FIG. 4 and the transparent covering layer in FIG. 5. It can be seen that omitting the adhesive and adopting the approach of placing the transparent covering layer on the glass layer so as to contact the glass layer not only can reduce the overall thickness of the stacked structure, but also make the cushioning effect of the stacked structure almost unaffected during bending.

In some embodiments, as shown in FIG. 2, the electronic device 100 further includes a touch sensing layer 120. The touch sensing layer 120 is disposed under the cover plate 110. In this way, the electronic device 100 can additionally provide a touch sensing function.

In some embodiments, the touch sensing layer 120 may include a silver nanowire (SNW; also known as AgNW) electrode layer, a metal grid, or electrode layers including indium tin oxide (ITO), but the disclosure is not limited in this regard. In the embodiment where the touch sensing layer 120 is a silver nanowire electrode layer, the touch sensing layer 120 includes a substrate and silver nanowires doped therein. The silver nanowires overlap each other in the substrate to form a conductive network. The substrate refers to the non-nanosilver material formed by the solution including the silver nanowires through processes such as coating, heating, and drying. The silver nanowires are distributed or embedded in the substrate and partially protrude out from the substrate. The substrate can protect the silver nanowires from the external environment, such as from corrosion and abrasion. In some embodiments, the substrate is compressible.

In some embodiments, as shown in FIG. 2, the electronic device 100 may further include a flexible display module (not shown) and a polarizing layer 130. The flexible display module may be disposed under the touch sensing layer 120. The polarizing layer 130 is disposed between the touch sensing layer 120 and the cover plate 110. The image displayed by the flexible display module can be viewed by the user sequentially through the touch sensing layer 120, the polarizing layer 130, and the cover plate 110, so that the display function of the electronic device 100 can be provided. In some embodiments, the flexible display module is, for example, an organic light emitting display module or an electronic paper. The polarizing layer 130 is configured to achieve specific optical effects. For example, the polarizing layer 130 can block the reflection of external light to ensure that the image displayed by the flexible display module can maintain a high contrast.

In some embodiments, the polarizing layer 130 is disposed on and in contact with the glass layer 111 of the cover plate 110, and the touch sensing layer 120 is disposed on and in contact with the polarizing layer 130.

In some embodiments, the electronic device 100 may only have a touch function without a display function. In other words, the aforementioned flexible display module and the polarizing layer 130 can be omitted from the electronic device 100, and the touch sensing layer 120 can be disposed on and in contact with the glass layer 111 of the cover plate 110.

In some embodiments, the stacking order of the glass layer 111 and the transparent covering layer 112 in FIG. 2 can be changed. In other words, the transparent covering layer 112 can be located between the glass layer 111 and the polarizing layer 130, and the polarizing layer 130 can be disposed on and in contact with the transparent covering layer 112. In some embodiments that do not include the polarizing layer 130, the touch sensing layer 120 is disposed on and in contact with the transparent covering layer 112.

erties, and reduce the difference in physical properties between the polymer material layer and the substrate.

The following table is the experimental data table of the Young's modulus measured under the predetermined thickness range of the composite cover plate of six examples.

|  | Control group 1 | Control group 2 | Embodiment 1 | Embodiment 2 | Embodiment 3 | Embodiment 4 |
|---|---|---|---|---|---|---|
| Thickness (μm) | 5-10 | 25-100 | 30-110 | 35-120 | 30-110 | 35-120 |
| Young's modulus (GPa) | 3-8 | 60-80 | 8-80 | 8-80 | 8-200 | 8-200 |

In practical applications, the coating process used for the aforementioned disposing and contacting can also be changed to a sputtering process or a printing process.

Figure 6:
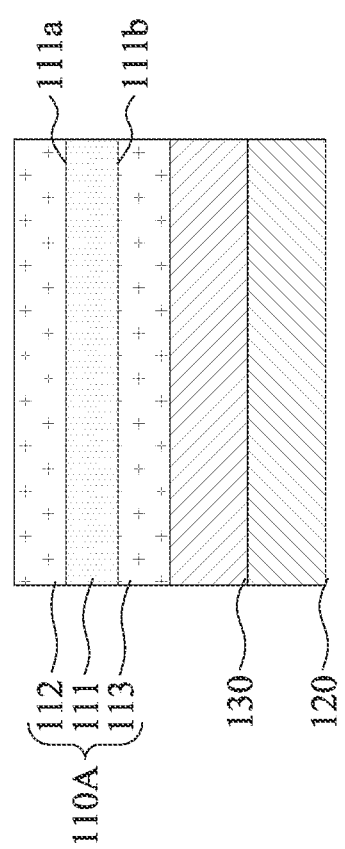
FIG. 6 is a schematic cross-sectional view showing some components of the electronic device in FIG. 1A according to another embodiment of the present disclosure.

Reference is made to FIG. 6. FIG. 6 is a schematic cross-sectional view showing some components of the electronic device 100 in FIG. 1A according to another embodiment of the present disclosure. The difference between the present embodiment and the embodiment shown in FIG. 2 is that the cover plate 110A in the present embodiment further includes another transparent covering layer 113. The glass layer 111 is laminated between the two transparent covering layers 112, 113. That is, the transparent covering layers 112, 113 are respectively disposed on and in contact with the first surface 111a and the second surface 111b. Therefore, the Young's modulus of the cover plate 110A of the present embodiment can be further increased. In some embodiments, in order to further increase the Young's modulus of the cover plates 110, 110A, an inorganic mixture can be added to one or both layers of the transparent covering layer (i.e., one or both of the transparent covering layers 112, 113) in a liquid state. For example, the inorganic mixture may contain graphene or diamond, preferably graphene dopants, but the present disclosure is not limited in this regard. In fact, the outstanding mechanical properties of graphene are high strength and high modulus, and tensile Young's modulus of graphene can reach up to 200 GPa, so that the maximum Young's modulus of the composite cover plate tends to 200 GPa. It is worth mentioning that the hardness of graphene is higher than that of diamond with Mohs hardness level 10. Graphene also has good toughness, can be bent, and has excellent ductility.

In some embodiments, the polymer material layer may further include nanoparticles, such as silicon dioxide, which can improve the defects of insufficient hardness and increase the surface strength. The introduction of the aforementioned inorganic mixture can enhance the adhesion between the polymer material layer and the glass layer 111. At the same time, the presence of the inorganic mixture reduces the expansion coefficient of the polymer material layer, so that the polymer material layer can be closer to an adhesion-enhancing coating (such as a hard coating layer 140 shown in FIG. 7), thereby avoiding the adhesion-enhancing coating and the polymer material layer from peeling due to the difference in expansion coefficient. Under the action of the coupling agent, the transparent silica nanoparticles can be further dispersed to improve the dispersion stability of the transparent nanoparticles in the polymer material layer. In addition, the chemical reaction between the silanol group of silicon dioxide and the coupling agent can also improve the film hardness, thermal expansion coefficient, and other prop- It should be noted that the control group 1 adopts a single-layer transparent covering layer. The control group 2 adopts a single-layer glass layer. Embodiment 1 adopts the cover plate 110 shown in FIG. 2 (i.e., the composite combination of the transparent covering layer 112 and the glass layer 111), and the Young's modulus of the composite formed cover plate will range from about 8 GPa to about 80 GPa, and preferably from about 50 GPa to about 80 GPa. Embodiment 2 adopts the cover plate 110A shown in FIG. 6 (i.e., the composite combination of the transparent covering layers 112, 113 and glass layer 111), and the Young's modulus of the composite formed cover plate will range from about 8 GPa to about 80 GPa, and preferably from about 50 GPa to about 80 GPa. Embodiment 3 adopts the stacked structure of the cover plate 110 shown in FIG. 2 and additionally adds graphene to the transparent covering layer 112, and the Young's modulus of the composite formed cover plate will range from about 8 GPa to about 200 GPa, and preferably from about 80 GPa to about 200 GPa. Embodiment 4 adopts the stacked structure of the cover plate 110A shown in FIG. 6 and additionally adds graphene to the transparent covering layers 112, 113, and the Young's modulus of the composite formed cover plate will range from about 8 GPa to about 200 GPa, and preferably from about 80 GPa to about 200 GPa.

It can be clearly seen from the above table that the Young's modulus of Example 1 with the cover plate 110 and the Young's modulus of the Control group 2 with the cover plate 110A are between the minimum value of the Young's modulus of the Control group 1, adopting the single-layer transparent covering layer, and the maximum value of the Young's modulus of the Control group 2, adopting the single-layer glass layer. In addition, the Young's modulus measured in Embodiments 3 and 4, where graphene is additionally added, can be significantly increased compared to Embodiments 1 and 2, where graphene is not added.

Figure 7:
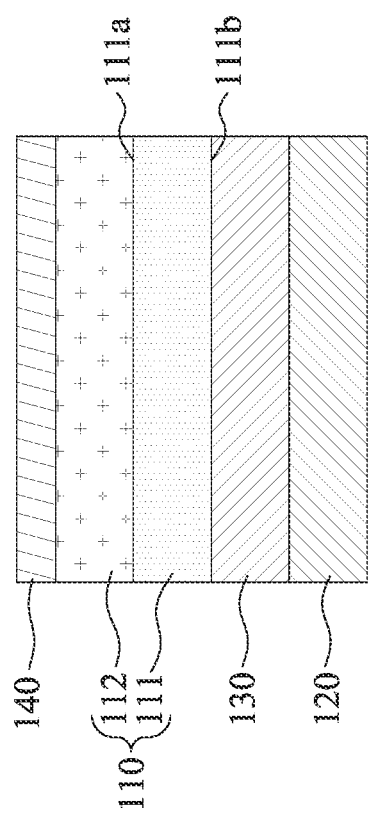
FIG. 7 is a schematic cross-sectional view showing some components of the electronic device in FIG. 1A according to another embodiment of the present disclosure.
Figure 8:
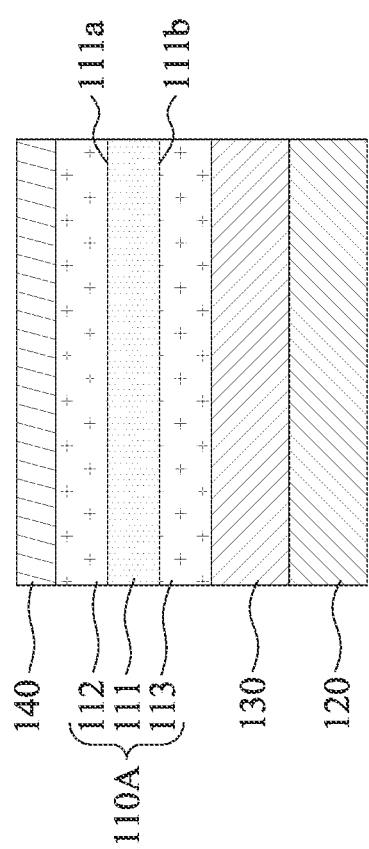
FIG. 8 is a schematic cross-sectional view showing some components of the electronic device in FIG. 1A according to another embodiment of the present disclosure.

Reference is made to FIGS. 7 and 8. FIG. 7 is a schematic cross-sectional view showing some components of the electronic device 100 in FIG. 1A according to another embodiment of the present disclosure. FIG. 8 is a schematic cross-sectional view showing some components of the electronic device 100 in FIG. 1A according to another embodiment of the present disclosure. The embodiments shown in FIGS. 7 and 8 are obtained by adding an additional hard coating layer 140 on the cover plate 110, 110A according to the embodiment shown in FIGS. 2 and 6, respectively. Since the cover plate 110, 110A is provided with the hard coating layer 140 above the cover plate 110, 110A, the surface wear resistance can be effectively improved.

According to the foregoing recitations of the embodiments of the disclosure, it can be seen that in the cover plate of the present disclosure, the transparent covering layer is disposed on and in contact with the glass layer (substantially ultra-thin glass). In other words, the transparent covering layer and the glass layer are not adhered to each other with adhesive (e.g., OCA). Therefore, the overall thickness of the cover plate and formation of pores and unnecessary cracks during the bending process can not only be reduced, but also the surface performance (e.g., wear resistance, hardness) of the cover plate can be effectively improved. In addition, the lack of the use of adhesive can simplify the manufacturing process, thereby reducing manufacturing costs.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A cover plate used in an electronic device, the cover plate comprising:
   a glass layer having a first surface and a second surface, the glass layer having a thickness from 25 microns to 100 microns; and
   at least one transparent covering layer laminated with the glass layer, the at least one transparent covering layer being disposed on and in contact with at least one of the first surface or the second surface, the at least one transparent covering layer being a polymer material layer and comprising polyimide (PI) or colorless polyimide (CPI), the polymer material layer being added with an inorganic mixture comprising graphene, wherein:
   the cover plate has a Young's modulus of about 80 GPa to about 200 GPa.

2. The cover plate of claim 1, wherein the thickness of the glass layer is from about 25 microns to about 35 microns.

3. The cover plate of claim 1, wherein the at least one transparent covering layer has a thickness from about 5 microns to about 10 microns.

4. The cover plate of claim 1, wherein the at least one transparent covering layer comprises a first transparent covering layer and a second transparent covering layer, and the glass layer is laminated between the first transparent covering layer and the second transparent covering layer.

5. An electronic device, comprising:
   the cover plate of claim 1; and
   a touch sensing layer disposed under the cover plate.

6. The electronic device of claim 5, wherein the touch sensing layer is disposed on and in contact with the second surface of the glass layer.

7. The electronic device of claim 5, wherein the touch sensing layer is disposed on and in contact with the at least one transparent covering layer.

8. The electronic device of claim 5, further comprising:
   a polarizing layer disposed between the touch sensing layer and the cover plate.

9. The electronic device of claim 8, wherein the polarizing layer is disposed on and in contact with the cover plate.

10. The electronic device of claim 5, further comprising:
    a hard coating layer disposed above the cover plate.

11. An electronic device, comprising:
    a first screen;
    a second screen rotatably connected to the first screen; and
    the cover plate of claim 1 covering the first screen and the second screen.

12. The electronic device of claim 11, wherein the first screen and the second screen are touch display screens.

13. The electronic device of claim 12, wherein each of the touch display screens comprises a force sensing layer.

14. An electronic device, comprising the cover plate of claim 1 and being a folding mobile phone.

15. The electronic device of claim 10, wherein the at least one transparent covering layer comprises a first transparent covering layer and a second transparent covering layer, the glass layer is laminated between the first transparent covering layer and the second transparent covering layer, and the hard coating layer is separated from the glass layer by the second transparent covering layer.

16. The cover plate of claim 1, wherein the at least one transparent covering layer is in direct contact with the glass layer with no adhesive intervening between the at least one transparent covering layer and the glass layer.

17. The cover plate of claim 1, wherein the graphene is graphene dopants.

18. The cover plate of claim 1, wherein the polymer material layer comprises silicon dioxide nanoparticles.

19. A method of manufacturing a cover plate, comprising:
    coating a polymer material layer on at least one surface of a glass layer; and
    drying the polymer material layer to form at least one transparent covering layer, wherein:
    the glass layer and the at least one transparent covering layer form a cover plate having a Young's modulus of about 10 GPa to about 200 GPa, and
    a drying temperature during the drying of the polymer material layer is from about 80 degrees Celsius to about 350 degrees Celsius.

20. The method of claim 19, wherein the coating the polymer material layer adopts a slot die coating process.

21. The method of claim 19, wherein the polymer material layer comprises polyimide (PI) or colorless polyimide (CPI).

22. The method of claim 19, comprising adding an inorganic mixture to the at least one transparent covering layer.

23. The method of claim 22, wherein the inorganic mixture comprises graphene.

24. The method of claim 19, wherein the polymer material layer comprises 3 wt % to 15 wt % polyamide acid.

* * * * *